US008502635B2

(12) United States Patent
Heinrich et al.

(10) Patent No.: US 8,502,635 B2
(45) Date of Patent: Aug. 6, 2013

(54) MAGNETOSTRICTIVE ELEMENT AND USE THEREOF

(75) Inventors: Ralf Heinrich, Weinheim (DE); Peter Ryzko, Laudenbach (DE)

(73) Assignee: Carl Freudenberg KG, Weinheim (DE)

( * ) Notice: Subject to any disclaimer, the term of this patent is extended or adjusted under 35 U.S.C. 154(b) by 760 days.

(21) Appl. No.: 11/632,674

(22) PCT Filed: Feb. 22, 2005

(86) PCT No.: PCT/EP2005/001794
§ 371 (c)(1),
(2), (4) Date: Jan. 17, 2007

(87) PCT Pub. No.: WO2006/007882
PCT Pub. Date: Jan. 26, 2006

(65) Prior Publication Data
US 2007/0241849 A1     Oct. 18, 2007

(30) Foreign Application Priority Data

Jul. 17, 2004  (DE) .................. 10 2004 034 723

(51) Int. Cl.
*H01F 27/24* (2006.01)
*H01F 27/02* (2006.01)
*H01F 5/00* (2006.01)
*H01F 17/04* (2006.01)

(52) U.S. Cl.
USPC .............. 336/233; 336/83; 336/200; 336/221

(58) Field of Classification Search
USPC .................. 336/233, 83, 200, 221
See application file for complete search history.

(56) References Cited

U.S. PATENT DOCUMENTS

| 2,433,898 | A | * | 1/1948 | Gilman | 335/215 |
| 3,389,274 | A | | 6/1968 | Robertson | |
| 4,710,709 | A | * | 12/1987 | Anderson et al. | 324/207.17 |
| 4,845,450 | A | * | 7/1989 | Porzio et al. | 335/215 |
| 5,072,158 | A | * | 12/1991 | Schuda | 315/276 |
| 5,223,046 | A | | 6/1993 | Kobayashi et al. | 148/301 |
| 5,291,967 | A | | 3/1994 | Aoki | |
| 5,440,278 | A | * | 8/1995 | Bartholomew | 332/103 |
| 5,453,291 | A | * | 9/1995 | Sasahara et al. | 427/8 |

(Continued)

FOREIGN PATENT DOCUMENTS

| DE | 1694049 | 5/1971 |
| DE | 4142885 | 7/1992 |

(Continued)

OTHER PUBLICATIONS

Bednarek, "The giant magnetostriction in ferromagnetic composites within an elastomer matrix", Applied Physics A (Materials Science & Processing), vol. 68, No. 1, Jan. 1999, pp. 63 to 67; XP 002330081.

(Continued)

*Primary Examiner* — Mohamad Musleh
*Assistant Examiner* — Tsz Chan
(74) *Attorney, Agent, or Firm* — Pearl Cohen Zedek Latzer, LLP

(57) ABSTRACT

A magnetostrictive element is provided comprising at least one device for generating a magnetic field, and at least one shaped part made of porous polymer containing ferromagnetic particles. The magnetostrictive element is characterized by having a distinct magnetostrictive effect.

20 Claims, 1 Drawing Sheet

U.S. PATENT DOCUMENTS

| | | | |
|---|---|---|---|
| 5,792,284 A * | 8/1998 | Cedell et al. | 148/301 |
| 5,814,687 A * | 9/1998 | Kasai et al. | 523/223 |
| 6,154,028 A * | 11/2000 | Bushida et al. | 324/253 |
| 6,273,965 B1 | 8/2001 | Pulvirenti et al. | 148/301 |
| 6,397,661 B1 * | 6/2002 | Grimes et al. | 73/24.06 |
| 6,847,153 B1 * | 1/2005 | Balizer | 310/311 |
| 2002/0004543 A1 | 1/2002 | Carman et al. | |
| 2002/0057156 A1 * | 5/2002 | Czimmek | 336/30 |
| 2003/0168295 A1 | 9/2003 | Han et al. | 188/267.1 |
| 2005/0013083 A1 * | 1/2005 | Takazawa et al. | 361/118 |

FOREIGN PATENT DOCUMENTS

| | | |
|---|---|---|
| EP | 0 361 969 A2 | 4/1990 |
| GB | 2037087 A * | 7/1980 |
| JP | 3-122139 | 5/1991 |
| JP | 2002-278425 | 9/2002 |
| JP | 2006-507676 | 3/2006 |
| WO | WO 92/20829 | 11/1992 |
| WO | WO 00/33324 | 6/2000 |
| WO | WO 03/075290 A1 | 9/2003 |

OTHER PUBLICATIONS

Bellan et al., "Field Dependence of Viscoelastic Properties of MR Elastomers", International Journal of Modern Physics B, vol. 16, Nos. 17 & 18 (2002), pp. 2447-2453, XP 009048159.

Farshad et al., "Magnetoactive elastomer composites", Polymer Testing 23 (2004) pp. 347-353, XP002330083.

Ginder et al., "Magnetostrictive Phenomena in Magnetorheological Elastomers", International Journal of Modern Physics B, vol. 16, Nos. 17 & 18 (2002), pp. 2412-2418, XP 009048165.

Pulliam et al., "Recent Advances in Magnetostrictive Particulate Composite Technology", Smart Structures and Materials 2002: Industrial and Commercial Applications of Smart Structures Technologies, Proceedings of SPIE vol. 4698 (2002), pp. 271 to 281; XP-002330082.

www.mide.com/pdf_html/Magnetostrictive_Elastomers.htm.

* cited by examiner

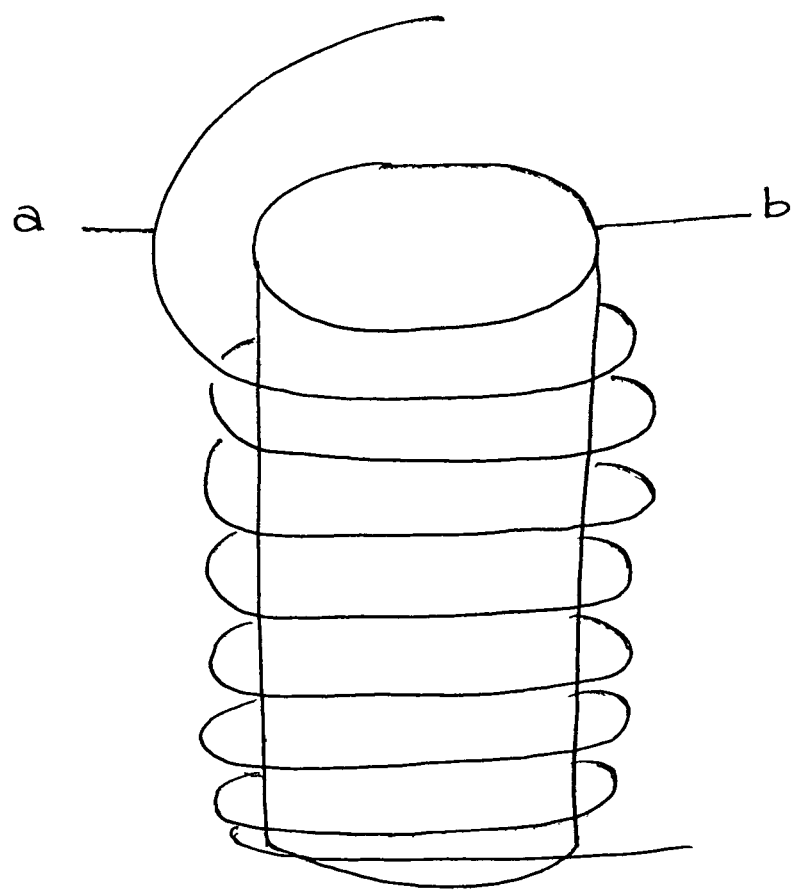

MAGNETOSTRICTIVE ELEMENT AND USE THEREOF

CROSS-REFERENCE TO RELATED APPLICATIONS

This application is a National Phase Application of PCT International Application No. PCT/EP2005/001794, international filing date Feb. 22, 2005, claiming priority of German Patent Application No. 10 2004 034 723.9, filed Jul. 17, 2004, which are hereby incorporated by reference in their entirety.

BACKGROUND

The present invention relates to magnetostrictive elements and the use thereof.

Magnetostrictive materials are known. They are understood to be materials whose dimensions change in the presence of a magnetic field, or which generate magnetic fields in the event of changes in their dimensions.

The magnetostrictive effect is like the piezoelectric effect, which causes changes in the dimensions of the material as a result of the presence of an electric field. With the piezoelectric effect, very high electric field strengths and very high voltages, on the order of several kilovolts, must typically be used in order to achieve significant changes in dimension. In contrast, magnetostrictive materials are known with which comparatively low voltages need to be used in order to achieve the desired changes in dimension. Such a material is known under the name of Terfenol-D; it is an alloy of iron, terbium and dysprosium.

Magnetostrictive materials are described, for example, in documents EP-A-361,969, WO-A-00/33,324, U.S. Pat. No. 6,273,965 and U.S. Pat. No. 5,223,046.

Magnetostrictive elastomer materials are also already known (cf. Midé Technology Corporation, Magnetostrictive Elastomers, for example, www.mide.com). Details of their composition are not provided in the document.

Furthermore, elastomer foams containing magnetic particles are also known.

JP-A-2002/278,424 discloses a foamed polymer material containing magnetic powder. This is used for sealing photocopiers, in order to prevent the escape of toner. Possible polymers are elastomers, such as ethylene-propylene elastomers.

JP-A-03/122,139 discloses magnetized rubber masses for the production of crosslinked foams. These are used for soundproofing and for absorbing vibrations.

JP-A-58/533,928 discloses flexible cellular elastomers containing metal powder. These are used for shielding against radiation.

None of these documents discloses the use of elastomer foams utilizing the magnetostrictive effect, for example the use of such foams as actuators, adaptive dampers or sensors for changes in material dimensions.

It has now been found that porous polymers containing ferromagnetic particles demonstrate a significantly enhanced magnetostrictive effect in comparison with the corresponding compact polymer materials.

SUMMARY OF THE INVENTION

An object of the present invention is the creation of filled porous polymers that demonstrate a marked magnetostrictive effect.

Another object of the present invention is to provide a method to move objects in a targeted manner or to absorb vibrations from objects or to determine changes in object dimensions, which is characterized by a high degree of sensitivity, is simple to implement and produces reproducible results.

The present invention relates to a magnetostrictive element including:
(a) at least one device for generating a magnetic field, and
(b) at least one porous polymer molded component containing ferromagnetic particles.

BRIEF DESCRIPTION OF THE DRAWINGS

The present invention will be better understood from a reading of the following description, given purely by way of example and with reference to the appended drawings, in which:

FIG. 1 shows schematically a magnetostrictive element according to the present invention.

DETAILED DESCRIPTION

Device (a) utilized according to the present invention may be of any type provided that it is able to be used to generate a magnetic field. Characteristically, this is an electrical conductor, preferably a metallic conductor, that is located near molded component (b), such that the magnetic field generated by device (a) is able to act upon molded component (b) or, alternatively, a magnetic field generated by molded component (b) is able to act upon device (a).

The magnetic field may be constant or may preferably change over time.

Device (a) is preferably made in the form of a coil located near molded component (b), and in a particularly preferred embodiment is wound around molded component (b), which specifically takes the form of a cylinder.

Molded component (b) may be of any shape and may be adapted to the specific intended purpose.

In a preferred embodiment, molded component (b) is in the form of a cylinder.

Fundamentally, any polymer may be used to produce porous polymer molded bodies. They are characteristically thermoplastic or crosslinked or partially crosslinked polymers, including elastomers.

These molded bodies contain pores filled with fluids, in other words with gas and/or liquid. The size of the pores may fluctuate over a wide range. Typical pore sizes range from about 10 μm to 3 mm. The pores may be of any shape. The molded bodies may have closed and/or open pores. The pores in the molded body characteristically amount to at least 5% of the volume of the body.

Molded bodies that are made from elastomer foams, including foams made from thermoplastic elastomers, are utilized in a particularly preferred embodiment.

In contrast to molded bodies made of compact polymers, the volume of the porous polymer molded bodies utilized according to the present invention may be changed under the influence of pressure.

The porous polymers utilized according to the present invention may be derived from any thermoplast. Examples of thermoplasts include synthetic polymers, such as thermoplastic polyurethanes, polysulfones, polyethers, polyketones and polyetherketones, polyamides, polyesters, poly(arylene oxide)s, poly(arylene sulfide)s, polyetherimides, polyacetals, vinyl polymers, polyacrylates and polyolefins.

In a particularly preferred embodiment, elastomer foams are utilized. For the purposes of this description, these are to be understood as foam plastics demonstrating rubber elasticity. They are thus macro-porous polymers, crosslinked chemically or physically, that demonstrate metal elasticity below their glass transition point and rubber elasticity at temperatures above their glass transition point, in other words they do not flow viscously even at high temperatures. The glass transition temperatures of the preferred elastomers are 20° C. and below. The elastomer foams utilized according to the present invention preferably demonstrate rubber elasticity up to their melting or decomposition temperature.

Typical rubbers preferred for use are acrylate rubber, polyester urethane rubber, brominated butyl rubber, polybutadiene, chlorinated butyl rubber, chlorinated polyethylene, epichlorohydrin homopolymer, polychloroprene, sulfonated polyethylene, ethylene acrylate rubber, ethylene vinyl acetate rubber, epichlorohydrin copolymers, sulfur-crosslinked or peroxide-crosslinked ethylene propylene copolymers (EP(D)M), polyether urethane rubber, ethylene vinyl acetate copolymer, fluoride rubber, silicone rubbers, such as fluorosilicone rubber (FVMQ) or vinyl-containing dimethyl polysiloxane, as well as hydrated nitrile rubber, butyl rubber, halobutyl rubber, polyoctenamer, polypentenamer, nitrile rubber, natural rubber, thioplasts, polyfluorophosphazenes, polynorbomene, styrene-butadiene rubber, carboxy-group-containing nitrile rubber or mixtures of one or more of these rubbers.

Other base materials preferably used for production of the porous polymers according to the present invention are thermoplastic elastomers, such as thermoplastic polyesters (TPE-E), thermoplastic polyamides (TPE-A), un-crosslinked thermoplastic polyolefins (TPE-O), partially crosslinked thermoplastic polyolefins (TPE-V), thermoplastic styrene polymers (TPE-S) and in particular thermoplastic polyurethanes (TPE-U).

The porous polymers may have cells of any type and size. Open-cell or closed-cell foams may be used, in other words either foams in which at least some of the individual pores are in contact with one another, or foams in which all pores are isolated from each other in the polymer matrix. Typical pore sizes range from 10 μm to 3 mm.

The porous polymers utilized according to the present invention may be produced using chemical and/or physical foaming processes in a manner known per se.

The polymers used for the production of the porous polymer molded bodies, in particular rubbers or thermoplastic elastomers, may be used in different forms, for example in granulate or another small-scale form. These polymers are usually mixed together with foaming agents, ferromagnetic materials and, if necessary, further additives, such as crosslinking agents, crosslinking aids, or other customary additives, such as softeners, fillers, mold release agents and/or pigments, and are foamed by heating.

Processing may occur in any type of equipment, such as kneading machines, rolling mills or extruders. Processing may be dry or wet.

Foaming may take place either within the mixing equipment or alternatively in a subsequent step, for example, by heating a rolled sheet in a heatable press while simultaneously reducing the molding pressure, or in an injection molding system.

Elastomer foams are usually processed with the use of crosslinking agents. Any of the usual types may be used for that purpose.

Typical crosslinking agents preferred for use are sulfur, fatty acids such as lauric acid or stearic acid, crosslinking resins such as polymethylol phenol resins, or compounds that also act as crosslinking accelerants. These include, for example, thiurams, guanidines, thiazoles, xanthates, dithiocarbamates, thiazole sulfene amides, dithiophosphates, peroxides, bisphenol triazine accelerants or chinondioxims.

All customary types of crosslinking aids may be used. Metal oxides, in particular magnesium oxide or zinc oxide, are preferred.

Any material having a ferromagnetic effect may be used as ferromagnetic materials. Preferred for use are ferromagnetic materials that also demonstrate a magnetostrictive effect, in other words materials in which at least one dimension changes under the influence of a magnetic field.

The ferromagnetic materials utilized according to the present invention may be either high-retentive or, preferably, low-retentive, in other words may either retain at least a residual magnetization or, preferably, lose their magnetization, after shutdown of the magnetic field.

The ferromagnetic materials are added to the porous polymer in particulate form. The portion of ferromagnetic particles in molded body (b) is characteristically 10% to 70% of the volume of the molded body. The particles may be of any shape, such as round, ellipsoid, irregular or fibrous. The average diameter of these particles ($D_{50}$ value) may fluctuate over a wide range. Typical particle diameters range from 0.1 μm to 1 mm, with the preferred range being 10 μm to 300 μm.

In addition to corpuscular or fibrous particles, conglomerates of such particles may also be used. The conglomerates may be of different forms, and may be network-like structures, such as percolation networks of fibers.

Ferromagnetic materials preferred for use contain cobalt and/or nickel and/or, in particular, iron.

Particularly preferred for use is powdered cobalt, powdered nickel or, in particular, powdered iron.

The ferromagnetic and magnetostrictive materials also preferred for use are, for example, metal mixtures or metal alloys that are known from EP-A-361,969, WO-A-00/33,324, U.S. Pat. No. 6,273,965 and U.S. Pat. No. 5,223,046.

Ferromagnetic materials preferred for use contain iron and/or cobalt and/or nickel as well as manganese, copper, rare earth metals or combinations of one or more of these metals.

Magnetostrictive materials particularly preferred for use are ferromagnetic alloys and contain iron and rare earth metals, in particular ferromagnetic alloys containing terbium, dysprosium and iron.

The present invention also relates to a method for absorbing vibrations from an object, including the following steps:
(i) Determining the vibration spectrum of the object using at least one sensor,
(ii) Generating a magnetic field that varies over time, its temporal pattern being such as to provide interference compensation for at least part of the object's vibration spectrum,
(iii) Action of the magnetic field on at least one molded component (b) as defined above, and production of a change over time in the dimensions of this molded component, and
(iv) Action of the molded component (b) on the object, so that its vibrations are at least partially compensated for.

In addition to this method for active vibration absorption, the present invention also relates to a method for passive vibration absorption.

This is a method for absorption of vibrations from an object, including the following steps:
(v) Generating a magnetic field of a predetermined size in a device (a) as defined above, that
(vi) Acts on at least one molded component (b) as defined above and thereby influences the absorption characteristics of this molded component in a predetermined manner.

Another method according to the present invention relates to the determination of the change in the dimensions of an object. This includes the following steps:
  (vii) Action of the object on a molded component (b) as defined above, so that upon changes in the dimensions of the object at least one dimension of the molded component (b) changes, and
  (viii) Determination of the strength of the magnetic field generated by the change in the dimensions of molded component (b) by inducing an electric current in an electrical conductor that is located near molded component (b).

A further method according to the present invention relates to targeted changing of the position of an object. This includes the following steps:
  (ix) Generation in a device (a) as defined above of a magnetic field of a predetermined size that
  (x) Acts on at least one molded component (b) as defined above and thereby influences the dimensions of the molded component in a predetermined manner, and
  (xi) Action of molded component (b) on the object, so that the latter is moved in a predetermined manner.

The present invention also relates to the use of porous polymers containing ferromagnetic particles as an actuator, the use of porous polymers containing ferromagnetic particles as a vibration absorption element, and the use of porous polymers containing ferromagnetic particles as a sensor for mechanical changes in objects, in particular as a vibration sensor.

What is claimed is:

1. A magnetostrictive element comprising:
  at least one device capable of generating a magnetic field, and
  at least one molded component capable of generating a magnetic field and made of a porous polymer containing ferromagnetic particles, wherein the porous polymer contains gas-filled pores, the pores amounting to at least 5% of the molded component volume, and is derived from thermoplastic elastomers,
  wherein the device is located near the molded component and
  wherein the device and molded component are able to act on each other and produce a change over time in dimensions of the molded component.

2. The magnetostrictive element as recited in claim 1 wherein the molded component is a cylinder, and where the device for generating a magnetic field is a coil of electrically conductive material wound around the molded component.

3. The magnetostrictive element as recited in claim 1 wherein the porous polymer is an elastomer foam.

4. The magnetostrictive element as recited in claim 3 wherein the elastomer foam--derives from acrylate rubber, polyester urethane rubber, brominated butyl rubber, polybutadiene, chlorinated butyl rubber, chlorinated polyethylene, epichlorohydrin homopolymer, polychloroprene, sulfonated polyethylene, ethylene acrylate rubber, ethylene vinyl acetate rubber, epichlorohydrin copolymers, sulfur-crosslinked or peroxide-crosslinked ethylene propylene copolymers (EP(D)M), polyether urethane rubber, ethylene vinyl acetate copolymer, fluoride rubber (FR), silicone rubbers, fluorosilicone rubbers, vinyl-containing dimethyl polysiloxane, as well as hydrated nitrile rubber, butyl rubber, halobutyl rubber, polyoctenamer, polypentenarner, nitrile rubber, natural rubber, thioplasts, polyfluorophosphazenes, polynorbornenes, styrene-butadiene rubbers, carboxy-groupcontaining nitrile rubbers or mixtures of one or more of these rubbers.

5. The magnetostrictive element as recited in claim 1 wherein the thermoplastic elastomers are thermoplastic polyesters, thermoplastic polyamides, un-crosslinked thermoplastic polyolefins, partially crosslinked thermoplastic polyolefins, thermoplastic styrene polymers and thermoplastic polyurethanes.

6. The magnetostrictive element as recited in claim 1 wherein the ferromagnetic particles contain iron, cobalt or nickel.

7. The magnetostrictive element as recited in claim 6 wherein the ferromagnetic particles are a magnetically low retentive material.

8. The magnetostrictive element as recited in claim 1 wherein the ferromagnetic particles are powdered cobalt, or powdered nickel.

9. The magnetostrictive element as recited in claim 6 wherein the ferromagnetic particles contain manganese, copper, rare earth metals or combinations of one or more of these metals.

10. The magnetostrictive element as recited in claim 9 wherein the ferromagnetic particles have alloys containing iron and rare earth metals.

11. The magnetostrictive element as recited in claim 10 wherein the alloys contain terbium, dysprosium and iron.

12. The magnetostrictive element as recited in claim 1 wherein the ferromagnetic particles are of an average diameter 0.1 μm to 1 mm.

13. The magnetostrictive element as recited in claim 1, wherein the pore size is between 10 μm and 3mm.

14. A method for absorbing vibrations from an object comprising the following steps:
  determining a vibration spectrum of the object using at least one sensor,
  generating a magnetic field that varies over time, a temporal pattern of the magnetic field providing interference compensation for at least part of the vibration spectrum,
  providing the magnetic field on at least one molded component made of porous polymer containing ferromagnetic particles, wherein the porous polymer contains gas-filled pores, the pores amounting to at least 5% of the molded component volume, and is derived from thermoplastic elastomers, and production of a change over time in dimensions and absorption characteristics of this molded component in a predetermined manner; and
  providing the molded component on the object, so that the vibrations are at least partially compensated for.

15. A method for determining the change in dimensions of an object comprising the following steps:
  providing the object on a molded component capable of generating a magnetic field and made of porous polymer containing ferromagnetic particles, wherein the porous polymer contains gas-filled pores, the pores amounting to at least 5% of the molded component volume, and is derived from thermoplastic elastomers, wherein the object and molded component are able to act on each other so that upon changes in the dimensions of the object at least one dimension of the molded component changes; and
  determining a strength of a magnetic field generated by the change in dimensions of the molded component by inducing an electric current in an electrical conductor located near the molded component.

16. A method for changing the position of an object in a targeted manner comprising the following steps:
  generating a magnetic field of a predetermined size in the object located on a molded component to act on the molded component, wherein the molded component is made of porous polymer containing ferromagnetic particles, wherein the porous polymer contains gas-filled pores, the pores amounting to at least 5% of the molded component volume, and is derived from thermoplastic elastomers, so as to influence the absorption characteristics of the molded component in a predetermined manner; and moving the object in a predetermined manner.

17. A method for actuating a device comprising:

generating a magnetic field of a predetermined size in an object located on a molded component to act on the molded component, wherein the molded component is made of porous polymers containing ferromagnetic particles as an actuator, wherein the porous polymer contains gas-filled pores, the pores amounting to at least 5% of the molded component volume, and is derived from thermoplastic elastomers, so as to influence the absorption characteristics of the molded component in a predetermined manner.

18. The method of claim 14, wherein the ferromagnetic particles act as an absorption element.

19. A method for sensing comprising:

sensing for mechanical changes in an object wherein the object is located on a molded component capable of generating a magnetic field and made of porous polymers containing ferromagnetic particles as a sensor, wherein the porous polymer contains gas-filled pores, the pores amounting to at least 5% of the molded component volume, and is derived from thermoplastic elastomers, and wherein the object and molded component are able to act on each other so that the mechanical changes are sensed.

20. The method as recited in claim 19 wherein the sensor is a vibration sensor.

* * * * *